US010014194B2

(12) United States Patent
Tokusho

(10) Patent No.: US 10,014,194 B2
(45) Date of Patent: Jul. 3, 2018

(54) HEATING DEVICE

(71) Applicant: NGK SPARK PLUG CO., LTD., Nagoya, Aichi (JP)

(72) Inventor: Noriaki Tokusho, Tsuruoka (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 15/793,052

(22) Filed: Oct. 25, 2017

(65) Prior Publication Data
US 2018/0122662 A1 May 3, 2018

(30) Foreign Application Priority Data

Oct. 28, 2016 (JP) .................. 2016-212170

(51) Int. Cl.
*H01L 21/67* (2006.01)
*H05B 3/26* (2006.01)
*H01L 21/687* (2006.01)
*C23C 16/458* (2006.01)
*C23C 16/46* (2006.01)
*H05B 3/28* (2006.01)

(52) U.S. Cl.
CPC .... *H01L 21/67109* (2013.01); *C23C 16/4586* (2013.01); *C23C 16/46* (2013.01); *H01L 21/67103* (2013.01); *H01L 21/68785* (2013.01); *H05B 3/265* (2013.01); *H05B 3/283* (2013.01)

(58) Field of Classification Search
CPC ......... H01L 21/67103; H01L 21/67109; H01L 21/68785; H01L 23/345; C23C 16/4586; H05B 3/26; H05B 3/262; H05B 3/265; H05B 3/28; H05B 3/283
See application file for complete search history.

(56) References Cited

U.S. PATENT DOCUMENTS

| 2007/0033824 A1* | 2/2007 | Okajima | H01L 21/67103 34/58 |
| 2009/0283034 A1* | 11/2009 | Natsuhara | C23C 16/4586 118/500 |
| 2010/0323313 A1* | 12/2010 | Toriya | C23C 16/4586 432/200 |
| 2014/0011153 A1* | 1/2014 | Lindley | H05B 3/265 432/227 |
| 2014/0251207 A1* | 9/2014 | Cuvalci | H01L 21/68785 118/500 |

(Continued)

FOREIGN PATENT DOCUMENTS

JP 2014-175491 A 9/2014

*Primary Examiner* — Stephen W Smoot
(74) *Attorney, Agent, or Firm* — Stites & Harbison, PLLC; Jeffrey A. Haeberlin; James R. Hayne

(57) ABSTRACT

A heating device includes a base body 2 that has a placement surface 2a for placing a wafer W thereon; a heating resistor 4 that is embedded in the base body 2; a cylindrical supporting body 3 that has one end surface 3a that is connected to a back surface 2b of the base body 2 that is on an opposite side of the placement surface 2a, the one end surface 3a having an open end; at least two supporting-body channels 5, 6 that are formed within a peripheral wall of the cylindrical supporting body 3; and a base-body channel 7 that is provided at only a portion of the base body 2 at an immediately overhead region of the cylindrical supporting body 3, and that extends through the base body 2 and connects the at least two supporting-body channels 5, 6 to each other.

4 Claims, 3 Drawing Sheets

(56) References Cited

U.S. PATENT DOCUMENTS

2015/0076135 A1\* 3/2015 Merry ................... H01L 21/683
      219/448.17
2015/0376783 A1 12/2015 Hanamachi et al.

\* cited by examiner

HEATING DEVICE

CROSS-REFERENCE TO RELATED APPLICATION

The present application claims priority to Japanese Patent Application No. 2016-212170, which was filed on Oct. 28, 2016, the disclosure of which is herein incorporated by reference in its entirety.

BACKGROUND OF THE INVENTION

Field of the Invention

The present invention relates to a heating device that heats, for example, a substrate, such as a wafer or a glass substrate for manufacturing a semiconductor device.

Description of the Related Art

Hitherto, in order to control the temperature of a placement surface for placing thereon a wafer for manufacturing a semiconductor device, a known heating device has included a heating resistor that is embedded in a base body made of a ceramic sintered material (refer to, for example, PTL 1).

RELATED ART DOCUMENT

PTL 1 is Japanese Unexamined Patent Application Publication No. 2014-175491.

In existing heating devices, depending upon a substrate that is placed on a placement surface of a base body, a temperature difference between a central portion and an outer portion of the base body may be desired. In order to provide a temperature difference between the central portion and the outer portion of the base body, one may consider providing a plurality of heating resistors. However, with the sizes of heating devices being reduced, there is a limit to the amount of wires that can be inserted into a cylindrical supporting body that supports a substrate. Therefore, it is difficult to provide a plurality of heating resistors.

BRIEF SUMMARY OF THE INVENTION

Accordingly, in view of the above-described points, it is an object of the present invention to provide a heating device that allows a temperature difference between a central portion and an outer portion of a placement surface of a base body to be adjusted without increasing the number of heating resistors.

1. To this end, according to the present invention, there is provided a heating device including a base body that has a placement surface for placing a substrate thereon; a heating resistor that is embedded in the base body; a cylindrical supporting body that has one end surface that is connected to a back surface of the base body that is on an opposite side of the placement surface, the one end surface having an open end; at least two supporting-body channels that are formed within a peripheral wall of the cylindrical supporting body; and a base-body channel that is provided at only a portion of the base body at an immediately overhead region of the cylindrical supporting body, and that extends through the base body and connects the at least two supporting-body channels to each other. In other words, there is provided a heating device including a cylindrical supporting body that has one end surface defining an open end and the cylindrical supporting body includes a peripheral wall defining at least two supporting-body channels. The heating device further includes a base body having a placement surface for placing a substrate thereon and a back surface opposite the placement surface with the one end surface of the cylindrical supporting body connected to the back surface of the base body. The base body defines a base-body channel at only a portion of the base body immediately overhead of the cylindrical supporting body, and the base-body channel extends through the base body and connects the at least two supporting-body channels to each other. The heating device further includes a heating resistor embedded in the base body.

According to the present invention, when a fluid is made to flow via two supporting-body channels that are formed within the peripheral wall of the cylindrical supporting body and via the base-body channel of the base body that is provided at only the immediately overhead region of the cylindrical supporting body, it is possible to cool only the central portion of the base body that is positioned immediately above the cylindrical supporting body. Therefore, the heating temperature of the central portion of the base body can be reduced without necessity to increase the number of heating resistors and without adjusting the output of the heating resistor.

2. In the present invention, it is desirable that the base-body channel have a ring shape (i.e., the base-body channel is ring shaped). According to the present invention, it is possible to form a ring-shaped base-body channel so as to avoid a wire that is inserted in the cylindrical supporting body and that is connected to the heating resistor embedded in the base body. Therefore, the arrangement of the wire is facilitated. In addition, since a fluid that flows through the ring-shaped base-body channel flows in the shape of a ring along the base-body channel, the central portion of the base body can be efficiently cooled.

3. In the present invention, it is desirable that a wire that is connected to the heating resistor be inserted in the cylindrical supporting body, and the wire be disposed so as to extend through the base-body channel. In other words, the heating device further includes a wire inserted in the cylindrical support with, extending through the base-body channel, and connected to the heating resistor.

According to such a structure, since a portion of the wire that extends through the base-body channel can be cooled by a fluid that flows in the base-body channel, the central portion of the base body can be efficiently cooled. In addition, the wire can be directly cooled by the fluid that flows in the base-body channel such that the temperature of the wire is constant. As a result, expansion and contraction of the wire due to temperature changes caused by heating the heating resistor are suppressed, as a result of which cracking in a connection portion between the heating resistor and the wire caused by the expansion and contraction of the wire can be suppressed.

4. In the present invention, it is desirable that the base-body channel includes a branch path that is connected to a space defined by an inner peripheral surface of the cylindrical supporting body. In other words, the cylindrical supporting body has an inner peripheral surface that defines a space and the base-body channel includes a branch path that is connected to the space. According to such a structure, the wire that is inserted in the cylindrical supporting body can be cooled by a fluid blown out (or sucked) from the branch path, and the central portion of the base body can be more efficiently cooled.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

A. First Embodiment

Figure 1:
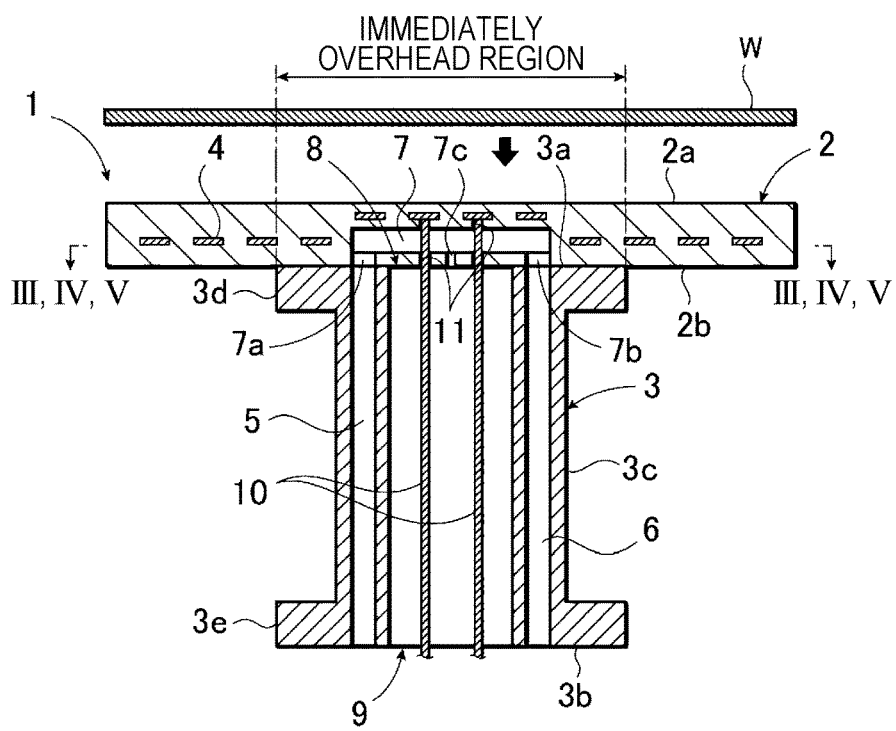
FIG. 1 is a schematic sectional view of a heating device according to a first embodiment of the present invention.

A heating device according to a first embodiment of the present invention is described with reference to the drawings. As shown in FIG. 1, a heating device 1 according to the first embodiment includes a base body 2 and a cylindrical supporting body 3. The base body 2 includes a placement surface 2a for placing a wafer W as a substrate thereon, and a back surface 2b that is on the opposite side of the placement surface 2a. The cylindrical supporting body 3 has one end surface 3a, the other end surface 3b, and a smooth peripheral surface 3c. The cylindrical supporting body 3 may be a rectangular columnar supporting body.

The cylindrical supporting body 3 is hollow. An open end 8 is provided at the one end surface 3a, and an open end 9 is provided at the other end surface 3b. In the embodiment, the open end 8 corresponds to an open end according to the present invention. Flanges 3d and 3e that extend outward in a radial direction are provided at the respective ends portions of the cylindrical supporting body 3 along an entire periphery. The open end 8 that is provided at the one end surface 3a of the cylindrical supporting body 3 is connected to the back surface 2b of the base body 2.

A heating resistor 4 is embedded in the base body 2. A wire 10 for supplying electrical power to the heating resistor 4 is connected to the heating resistor 4 via the cylindrical supporting body 3. The base body 2 has a guide path 11 that guides the wire 10 from the back surface 2b to the heating resistor 4. The guide path 11 crosses a base-body channel 7. The wire 10 is connected to the heating resistor 4 via the guide path 11.

Figure 2:
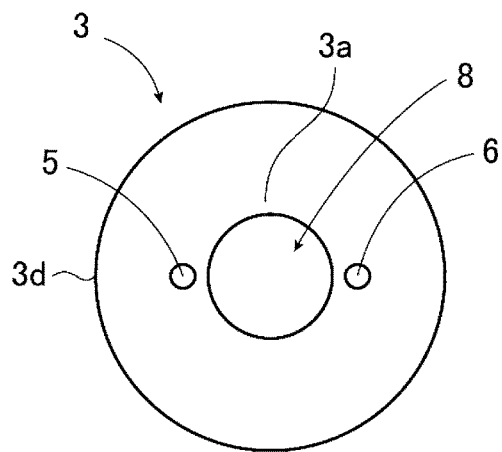
FIG. 2 is a plan view of a cylindrical supporting body according to the first embodiment.

Two supporting-body channels, that is, a first supporting-body channel 5 and a second supporting-body channel 6, extending in a direction from the other end surface 3b to the one end surface 3a (an axial direction of the cylindrical supporting body 3) are formed within a peripheral wall of the cylindrical supporting body 3. FIG. 2 is a plan view of the cylindrical supporting body 3 as seen from thereabove. The first supporting-body channel 5 and the second supporting-body channel 6 are symmetrically positioned with reference to a central axial line of the cylindrical supporting body 3. The supporting-body channels according to the present invention need not be symmetrically positioned with reference to the central axial line of the cylindrical supporting body 3.

The base body 2 has the base-body channel 7 that connects the first supporting-body channel 5 and the second supporting-body channel 6 via a first connection path 7a and a second connection path 7b. The base-body channel 7 is provided at only an immediately overhead region of the cylindrical supporting body 3 (this means both "at only part of the immediately overhead region" and "the entire immediately overhead region"; in the first embodiment, the base-body channel 7 is provided at only part of the immediately overhead region as is clear from FIG. 3 described below).

Figure 3:
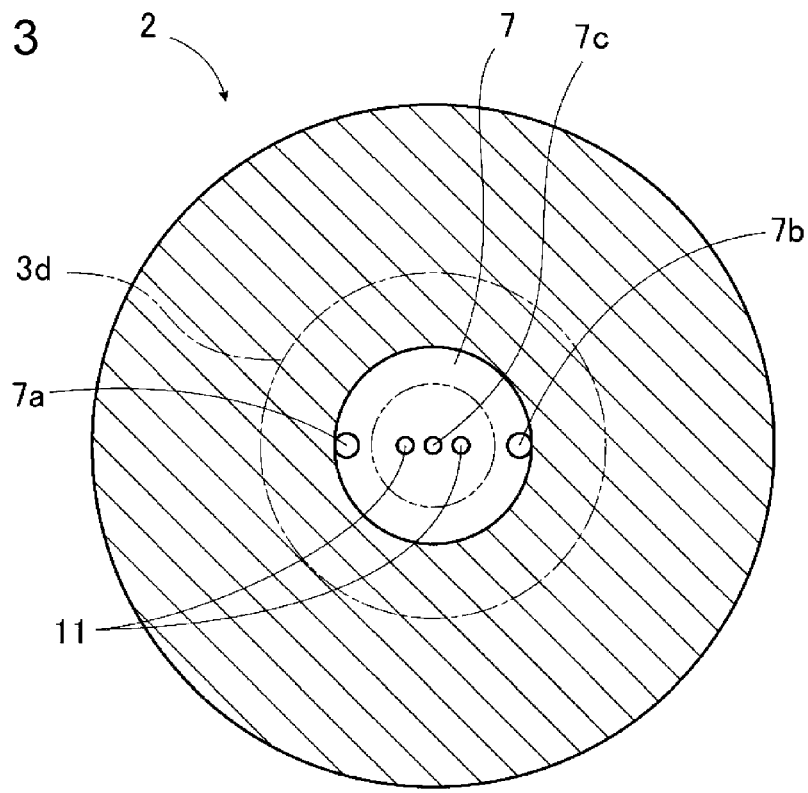
FIG. 3 is a sectional view of a base body according to the first embodiment taken along line III-III in FIG. 1 and as seen from above FIG. 1.

FIG. 3 is a sectional view of the base body according to the first embodiment taken along line III-III in FIG. 1 and as seen from above FIG. 1. As shown in FIG. 3, the base-body channel 7 has a disc shape. An alternate long and short dash line in FIG. 3 indicates that its inner side corresponds to the immediately overhead region of the cylindrical supporting body 3. An alternate long and two short dash line in FIG. 3 indicates an inner peripheral surface of the cylindrical supporting body 3. The disc-shaped base-body channel 7 has a branch path 7c that is connected to a space defined by the inner peripheral surface of the cylindrical supporting body 3 at a central portion thereof. The wire 10 may be inserted into the branch path 7c. In this case, the branch path 7c functions as a guide path, and may be formed with a large diameter that allows the wire 10 to pass therethrough; or a plurality of branch paths may be formed in correspondence with the position of the wire 10.

According to the heating device 1 of the first embodiment, when a fluid (gas) is made to flow via the two supporting-body channels, that is, the first supporting-body channel 5 and the second supporting-body channel 6, that are formed within the peripheral wall of the cylindrical supporting body 3 and via the base-body channel 7 of the base body 2 that is provided at only the immediately overhead region of the cylindrical supporting body 3, it is possible to cool only a central portion of the base body 2 that is positioned immediately above the cylindrical supporting body 3. Therefore, without increasing the number of individual heating resistors and without adjusting the output of the heating resistor, the temperature difference between the central portion and an outer portion of the placement surface 2a of the base body 2 can be adjusted by adjusting the amount of fluid (gas) that is supplied or sucked.

In the heating device 1 according to the first embodiment, the wire 10 extends through the base-body channel 7. Therefore, a portion of the wire 10 that extends through the base-body channel 7 is cooled by a fluid (gas) that flows in the base-body channel 7, so that the central portion of the placement surface 2a of the base body 2 can be efficiently cooled.

The heating device 1 according to the first embodiment includes the branch path 7c that connects the disc-shaped base-body channel 7 and an internal space defined by the inner peripheral surface of the cylindrical supporting body 3. Therefore the wire 10 inserted into the cylindrical supporting body 3 can be cooled by a fluid (gas) that is blown out (or sucked) to the internal space of the cylindrical supporting body 3 from the branch path 7c, so that the central portion of the base body 2 that directly contacts the wire 10 can be more efficiently cooled.

Even if the branch path 7c is not provided, it is possible to provide the operational effect according to the present invention of, "making it possible to provide a difference between the heating temperature of the central portion of the base body 2 and the heating temperature of the outer portion of the base body 2 without increasing the number of individual heating resistors and adjusting the output of the heating resistor".

A fluid (gas) that flows in the disc-shaped base-body channel 7 may not properly flow up to an end portion of the base-body channel 7 in a radial direction. In this case, a guide may be provided to allow the fluid (gas) to flow uniformly even in the disc-shaped channel 7.

Although, in the embodiment, two supporting-body channels 5 and 6 are described, the number of supporting-body channels according to the present invention only needs to be more than one, so that the number of supporting-body channels may be three or more.

B. Second Embodiment

Figure 4:
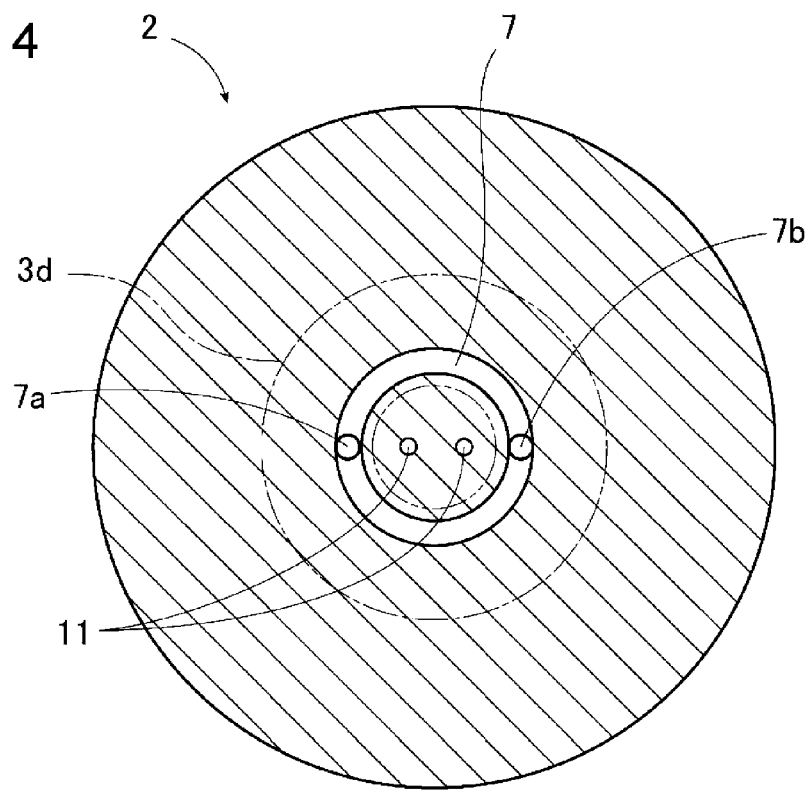
FIG. 4 is a sectional view of a base body of a heating device according to a second embodiment of the present invention.

A heating device 1 according to a second embodiment of the present invention is described with reference to FIG. 4. FIG. 4 is a sectional view of a base body 2 according to the second embodiment taken along line IV-IV in FIG. 1 (which shows the first embodiment) and as seen from thereabove as in FIG. 3. Structural features that correspond to those according to the first embodiment are given the same reference numerals and are not described below. The heating device 1 according to the second embodiment has the same structure as the first embodiment except that a base-body channel 7 has a ring shape.

According to the heating device 1 of the second embodiment, it is possible to form the ring-shaped base-body channel 7 so as to avoid a wire 10 that is inserted in a cylindrical supporting body 3 and that is connected to a heating resistor 4 embedded in a base body 2. Therefore, the arrangement of the wire 10 is facilitated. In addition, since a fluid (gas) that flows through the ring-shaped base-body channel 7 flows in the shape of a ring along the base-body channel 7, a central portion of the base body 2 can be efficiently cooled.

Even in the heating device 1 according to the second embodiment, as in the first embodiment, when a fluid is made to flow via two supporting-body channels, that is, a first supporting-body channel 5 and a second supporting-body channel 6, that are formed within a peripheral wall of the cylindrical supporting body 3 and via the base-body channel 7 of the base body 2 that is provided at only an immediately overhead region of the cylindrical supporting body 3, it is possible to cool only the central portion of the base body 2 that is positioned immediately above the cylindrical supporting body 3. Therefore, a difference between the heating temperature of the central portion of the base body 2 and the heating temperature of the outer portion of the base body 2 can be provided without increasing the number of individual heating resistors and adjusting the output of the heating resistor.

C. Third Embodiment

Figure 5:
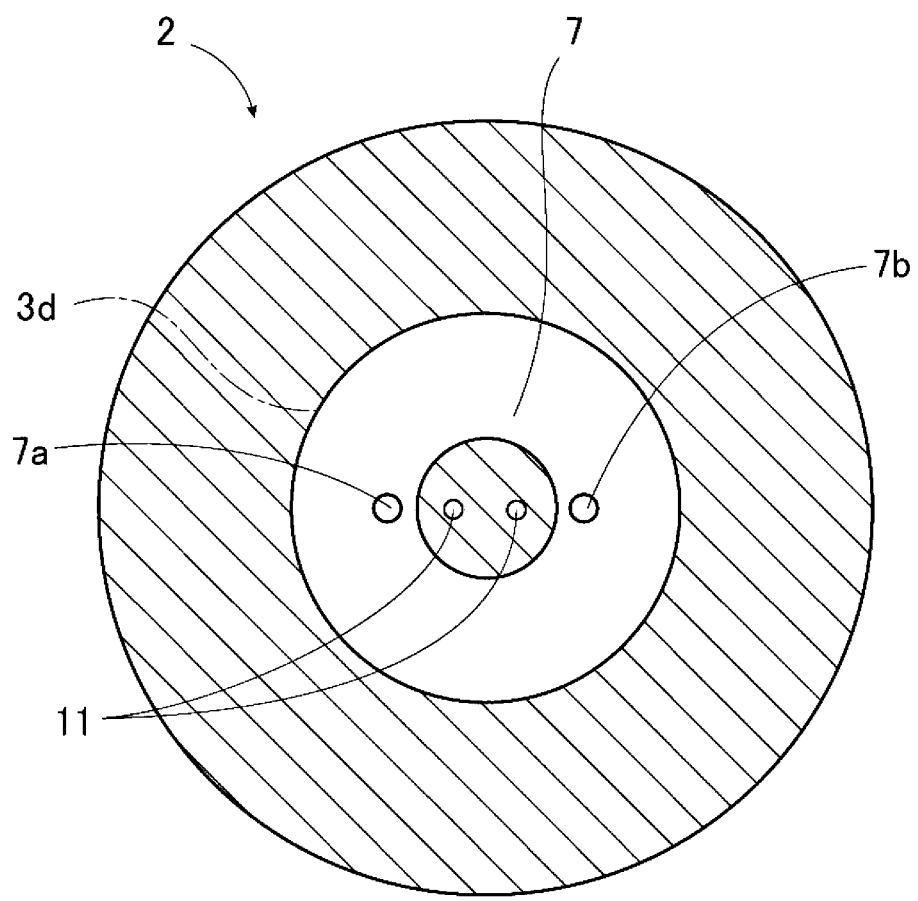
FIG. 5 is a sectional view of a base body of a heating device according to a third embodiment of the present invention.

A heating device 1 according to a third embodiment of the present invention is described with reference to FIG. 5. FIG. 5 is a sectional view of a base body 2 according to the third embodiment taken along line V-V in FIG. 1 and as seen thereabove as in FIG. 3. Structural features that correspond to those according to the first embodiment are given the same reference numerals and are not described below. The heating device 1 according to the third embodiment has exactly the same structure except that a base-body channel 7 according to the third embodiment differs from the base-body channel 7 according to the second embodiment in that the base-body channel 7 is formed with a ring shape having a channel width that is larger than that according to the second embodiment such that the channel width is from an outer edge of the immediately overhead region of the cylindrical supporting body 3 to an inner peripheral surface of the cylindrical supporting body 3.

Even in the heating device 1 according to the third embodiment, as in the second embodiment, it is possible to form a ring-shaped base-body channel 7 so as to avoid a wire 10 that is inserted in the cylindrical supporting body 3 and that is connected to a heating resistor 4 embedded in the base body 2. Therefore, the arrangement of the wire 10 is facilitated. In addition, since a fluid (gas) that flows through the ring-shaped base-body channel 7 flows in the shape of a ring along the base-body channel 7, a central portion of the base body 2 can be efficiently cooled.

Even in the heating device 1 according to the third embodiment, as in the first embodiment and the second embodiment, when a fluid is made to flow via two supporting-body channels, that is, a first supporting-body channel 5 and a second supporting-body channel 6, that are formed within a peripheral wall of the cylindrical supporting body 3 and via the base-body channel 7 of the base body 2 that is provided at only an immediately overhead region of the cylindrical supporting body 3, it is possible to cool only a central portion of the base body 2 that is positioned immediately above the cylindrical supporting body 3. Therefore, a difference between the heating temperature of the central portion of the base body 2 and the heating temperature of an outer portion of the base body 2 can be provided without increasing the number of individual heating resistors and adjusting the output of the heating resistor.

Although, in the third embodiment, the base-body channel 7 is formed with a ring shape having a channel width that is larger than that according to the second embodiment such that the channel width of the base-body channel 7 is from the outer edge of the immediately overhead region of the cylindrical supporting body 3 to the inner peripheral surface of the cylindrical supporting body 3, the ring-shaped base-body channel according to the present invention is not limited thereto. For example, the width of the base-body channel 7 may be set so that a guide path 11 crosses the ring-shaped base-body channel 7. In this case, the branch path in the first embodiment can be provided.

What is claimed is:

1. A heating device comprising:
   a cylindrical supporting body that has one end surface defining an open end, the cylindrical supporting body including a peripheral wall defining at least two supporting-body channels;
   a base body having a placement surface for placing a substrate thereon and a back surface opposite the placement surface with the one end surface of the cylindrical supporting body connected to the back surface of the base body, the base body defining a base-body channel at only a portion of the base body immediately overhead of the cylindrical supporting body, the base-body channel extending through the base body and connecting the at least two supporting-body channels to each other; and
   a heating resistor embedded in the base body.

2. The heating device according to claim 1, wherein the base-body channel is ring shaped.

3. The heating device according to claim 1, further comprising a wire inserted in the cylindrical supporting body, extending through the base-body channel, and connected to the heating resistor.

4. The heating device according to claim 1, wherein the cylindrical supporting body has an inner peripheral surface that defines a space and the base-body channel includes a branch path that is connected to the space.

* * * * *